(12) United States Patent
Baik

(10) Patent No.: US 7,488,648 B2
(45) Date of Patent: Feb. 10, 2009

(54) METHODS OF FABRICATING SCALABLE TWO-TRANSISTOR MEMORY DEVICES HAVING METAL SOURCE/DRAIN REGIONS

(75) Inventor: Seung-jae Baik, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 333 days.

(21) Appl. No.: 11/158,455

(22) Filed: Jun. 22, 2005

(65) Prior Publication Data

US 2005/0285183 A1 Dec. 29, 2005

(30) Foreign Application Priority Data

Jun. 23, 2004 (KR) ................ 10-2004-0046962

(51) Int. Cl.
*H01L 21/336* (2006.01)
(52) U.S. Cl. .............. 438/266; 438/257; 438/258; 438/267; 438/261
(58) Field of Classification Search ......... 438/257–258, 438/266–267, 261
See application file for complete search history.

(56) References Cited

U.S. PATENT DOCUMENTS

| | | | | |
|---|---|---|---|---|
| 6,475,857 | B1 * | 11/2002 | Kim et al. | ................ 438/240 |
| 2003/0067024 | A1 * | 4/2003 | Kim et al. | ................ 257/296 |
| 2004/0238974 | A1 | 12/2004 | Baik | |

FOREIGN PATENT DOCUMENTS

| JP | 62-274775 | 11/1987 |
|---|---|---|
| JP | 2001-250950 | 9/2001 |
| JP | 2003-067021 | 4/2003 |
| KR | 2002-0096809 | 12/2002 |
| KR | 1020030013586 A | 2/2003 |

OTHER PUBLICATIONS

"Design of 10-nm Scale Recessed Asymmetric Schottky Barrier Mosfets" Earliest publication date unknown but for examination purposes it is believed to be before filing date of this application. 9 sheets.

Wang et al; "Sub-40 nm PtSi Schottky source/drain metal-oxide-semiconductor field-effect transistors" Applied Physics Letters, vol. 74, No. 8, Feb. 22, 1999, pp. 1174-1176.

Notice to Submit Response corresponding to Korean Patent Application No. 10-2004-0046962 mailed Jan. 27, 2006.

* cited by examiner

*Primary Examiner*—Thanh Nguyen
(74) *Attorney, Agent, or Firm*—Myers Bigel Sibley & Sajovec, PA

(57) ABSTRACT

A scalable two-transistor memory (STTM) device includes a planar transistor and a vertical transistor on a semiconductor substrate. The planar transistor includes spaced apart metal silicide source/drain regions on the substrate and a floating gate electrode on the substrate between the metal silicide source/drain regions that controls a channel region of the planar transistor. The vertical transistor includes a tunnel junction structure on the floating gate electrode and a control gate electrode on a sidewall of the tunnel junction structure that controls a channel region of the vertical transistor. Related methods of forming STTM devices are also discussed.

6 Claims, 6 Drawing Sheets

METHODS OF FABRICATING SCALABLE TWO-TRANSISTOR MEMORY DEVICES HAVING METAL SOURCE/DRAIN REGIONS

CROSS-REFERENCE TO RELATED APPLICATION

This application claims priority from Korean Patent Application No. 10-2004-0046962, filed on Jun. 23, 2004, in the Korean Intellectual Property Office, the disclosure of which is hereby incorporated by reference herein in its entirety.

BACKGROUND OF THE INVENTION

1. Field of the Invention

The present invention relates to semiconductor devices, and more particularly, to scalable two-transistor memory devices and methods of fabricating the same.

2. Description of the Related Art

Scalable two-transistor memory (STTM) cells may offer advantages of both Dynamic Random Access Memory (DRAM) and flash memory devices. STTM cells are nonvolatile memory devices requiring no refresh, which may offer advantages such as high-speed operation, low power consumption, and high packing density.

FIG. 1 is an equivalent circuit diagram of a conventional STTM cell. FIG. 2 is a cross-sectional view illustrating the STTM cell structure shown in FIG. 1. The equivalent circuit diagram shown in FIG. 1 illustrates a single unit cell, while the STTM cell structure shown in FIG. 2 illustrates two unit cells that share a common source region.

Referring now to FIG. 1, the STTM cell includes two transistors: a planar transistor PT, and a vertical transistor VT that is formed on the planar transistor PT. The planar transistor PT includes a source region connected to a first word line 104 and a drain region connected to a sensing line 102. A floating gate conductive layer FG is formed on a channel forming region between the source region and the drain region on a gate insulating layer. The floating gate conductive layer FG forms the gate electrode for the planar transistor PT. The floating gate conductive layer FG also forms a drain region for the vertical transistor VT. The vertical transistor VT includes a multiple tunnel junction structure 110 formed on the floating gate conductive layer FG and a control gate conductive layer and a data line conductive layer respectively connected to a control line 106 and a second word line 108.

A cross-sectional view of the STTM cell of FIG. 1 will now be described with reference to FIG. 2. An active region defined by an isolation layer 204 is formed in a portion of a p-type well region 202 on a semiconductor substrate 200. A common source region 206 is formed in the active region, and a drain region 208 is formed in the active region on each side of the common source region 206. The common source region 206 is connected to the first word line 104 of FIG. 1, and the drain region 208 is connected to the sensing line 102 of FIG. 1. A region between the source region 206 and each drain region 208 forms a channel forming region 210 where an inversion layer channel may be formed. A gate insulating layer 212 is formed on the channel forming region 210, and a floating gate conductive layer 214 is formed thereon. The floating gate conductive layer 214 forms a gate electrode for the planar transistor PT. Accordingly, the source region 206, the drain region 208, the channel forming region 210, the gate insulating layer 212, and the floating gate conductive layer 214 form the planar transistor PT of FIG. 1.

Still referring to FIG. 2, a multiple tunnel junction structure MTJ is formed on the floating gate conductive layer 214. The multiple tunnel junction structure MTJ is formed by sequentially stacking a first tunnel barrier layer 216, a first channel conductive layer 218, a second tunnel barrier layer 220, a second channel conductive layer 222, and a third tunnel barrier layer 224. A data line conductive layer 226 connected to a data line (i.e., the second word line 108 shown in FIG. 1) and an insulating layer 228 are sequentially formed on the multiple tunnel junction structure MTJ. The floating gate conductive layer 214, the multiple tunnel junction structure MTJ, the data line conductive layer 226, and the insulating layer 228 are surrounded by a sidewall insulating layer 230. A control gate conductive layer 232 connected to the control line 106 is formed on the sidewall insulating layer 230. Accordingly, the floating gate conductive layer 214 forms a drain region, the multiple tunnel junction structure MTJ forms a channel region, the data line conductive layer 226 forms a source region, the sidewall insulating layer 230 forms a gate insulating layer, and the control gate conductive layer 232 forms a gate electrode for the vertical transistor VT of FIG. 1.

In a conventional STTM cell structure as described above, charges may be stored in the floating gate conductive layer 214 using a tunneling phenomenon produced by applying a predetermined voltage to the floating gate conductive layer 214. The charges may penetrate through tunnel barrier layers formed between the channel conductive layers of the vertical transistor VT, thereby forming a channel in the multiple tunnel junction structure MTJ in a vertical direction. As a result, performance of the STTM cell may not be degraded even when the widths of the floating gate conductive layer 214, multiple tunnel junction structure MTJ, and data line conductive layer 226 are reduced, because the channel is formed vertically. However, in the planar transistor PT, when the distance between the source region 206 and the drain region 208 is decreased, short channel effects may occur, thereby degrading performance. Although the source region 206 and the drain region 208 can be formed to a shallower junction depth to alleviate short channel effects, such an approach has its limits. Further, the resistance of the source region 206 and the drain region 208 may be increased, which may also degrade performance of the device.

SUMMARY OF THE INVENTION

According to some embodiments of the present invention, a scalable two-transistor memory (STTM) device may include a planar transistor and a vertical transistor on a semiconductor substrate. The planar transistor may include spaced apart metal silicide source/drain regions on the substrate and a floating gate electrode on the substrate between the metal silicide source/drain regions that controls a channel region of the planar transistor. The vertical transistor may include a tunnel junction structure on the floating gate electrode and a control gate electrode on a sidewall of the tunnel junction structure that controls a channel region of the vertical transistor.

In some embodiments, the metal silicide source/drain regions may be tungsten silicide regions, nickel silicide regions, and/or erbium silicide regions.

In other embodiments, the tunnel junction structure may include at least one channel conductive layer and at least one tunnel barrier layer alternately stacked in a vertical direction on the floating gate electrode. The tunnel barrier layer may be a silicon nitride layer. The channel conductive layer may be an intrinsic polysilicon layer and/or a polysilicon layer doped with p-type impurity ions.

In yet other embodiments, the STTM device may further include a data line conductive layer on the tunnel junction structure. The data line conductive layer may be a polysilicon layer doped with n-type impurity ions. The floating gate electrode may be a polysilicon layer doped with n-type impurity ions.

According to further embodiments of the present invention, a semiconductor memory device may include spaced apart metal-containing source/drain regions on a semiconductor substrate, a floating gate storage node on the substrate between the metal-containing source/drain regions, a tunnel junction structure comprising a tunnel junction barrier layer and a channel conductive layer on the floating gate storage node, and a control gate electrode on a sidewall of the tunnel junction structure.

In some embodiments, the metal-containing source/drain regions may be metal silicide regions formed on the substrate.

In other embodiments, the tunnel junction structure may include a plurality of channel conductive layers and tunnel barrier layers alternately stacked in a vertical direction on the floating gate storage node.

According to some embodiments of the present invention, a method of forming a scalable two-transistor memory (STTM) device may include forming a vertical transistor having a storage node on a semiconductor substrate. The vertical transistor may include a tunnel junction structure on the storage node and a control gate electrode on a sidewall of the tunnel junction structure that controls a channel region of the vertical transistor. The method may further include forming a planar transistor having spaced apart metal-containing source/drain regions on the substrate adjacent respective opposite sides of the storage node of the vertical transistor. The storage node of the vertical transistor may form a floating gate electrode that controls a channel region of the planar transistor.

In some embodiments, forming a vertical transistor may include forming a storage node on a surface of the substrate. A tunnel junction structure including a tunnel barrier layer and a channel conductive layer may be formed on the storage node. Sidewall insulating layers and a control gate electrode may be formed on opposing sidewalls of the tunnel junction structure.

In other embodiments, forming a planar transistor may include forming metal layers on the substrate adjacent respective opposite sides of the storage node, and performing a silicidation process on the substrate to form spaced apart metal silicide source/drain regions on the substrate prior to forming the control gate electrode. The metal silicide source/drain regions may be formed of tungsten silicide, nickel silicide, and/or erbium silicide.

In some embodiments, forming the vertical transistor may include forming a data line conductive layer on the tunnel junction structure prior to forming the control gate electrode.

In other embodiments, forming the tunnel junction structure may include alternately forming a plurality of tunnel barrier layers and channel conductive layers on the floating gate electrode.

In some embodiments, the storage node may be a polysilicon layer doped with n-type impurity ions, the tunnel barrier layers may be silicon nitride layers, the channel conductive layers may be intrinsic polysilicon layers and/or polysilicon layers doped with p-type impurity ions, and the data line conductive layer may be a polysilicon layer doped with n-type impurity ions.

DETAILED DESCRIPTION OF EMBODIMENTS OF THE INVENTION

Figure 1:
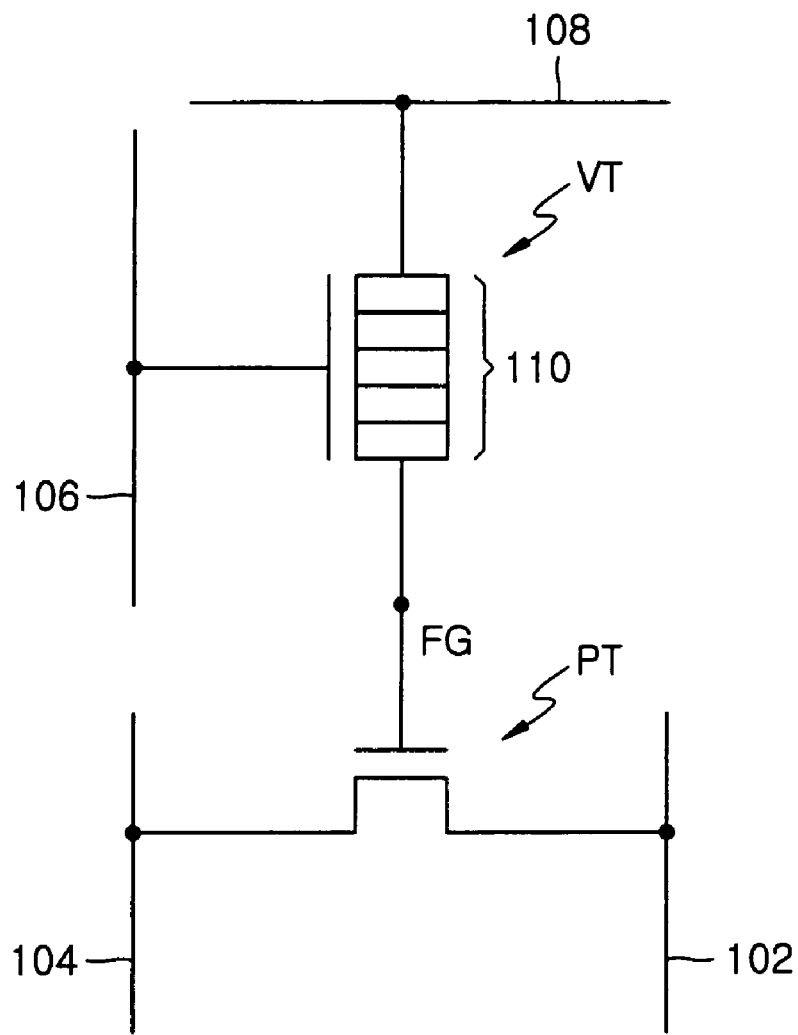
FIG. 1 illustrates an equivalent circuit diagram of a conventional STTM cell.
Figure 2:
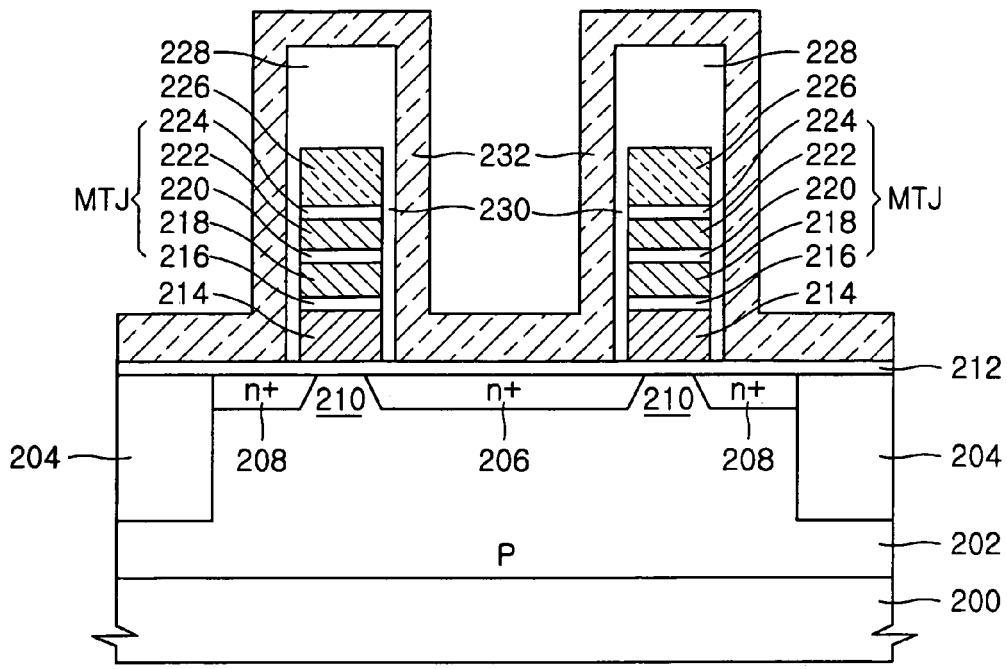
FIG. 2 is a cross-sectional view illustrating a structure of the conventional STTM cell of FIG. 1.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 3:
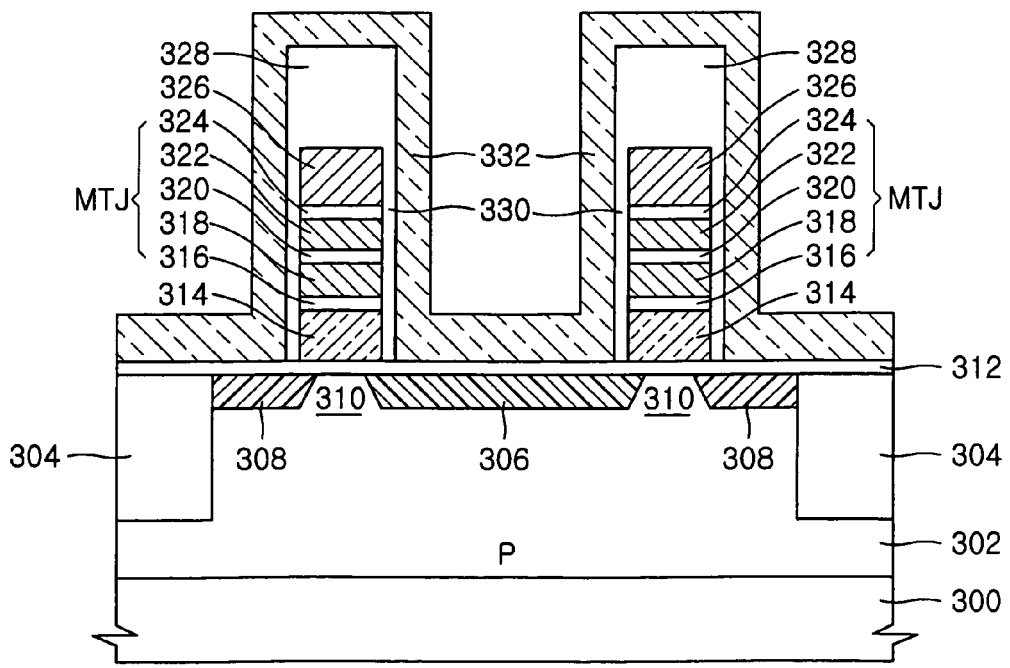
FIG. 3 is a cross-sectional view illustrating a structure of a STTM cell according to some embodiments of the present invention.

FIG. 3 is a cross-sectional view illustrating the structure of a STTM cell according to some embodiments of the present invention, in which two unit cells are illustrated.

Referring to FIG. 3, the STTM cell is constructed such that a single unit cell includes two transistors, i.e., a planar transistor and a vertical transistor. The planar transistor includes a first metal-containing source/drain region 306, a second metal-containing source/drain region 308, a gate insulating layer 312, and a floating gate conductive layer 314. The vertical transistor includes the floating gate conductive layer 314, a data line conductive layer 326, a multiple tunnel junction structure MTJ, a side insulating layer 330, and a control gate conductive layer 332.

More particularly, a p-type well region 302 is formed on a semiconductor substrate 300. The p-type well region 302 has an active region defined by an isolation layer 304. The isolation layer 304 may be formed in a trench surrounding the active region, using a process such as local oxidation of silicon (LOCOS). The first metal-containing source/drain region 306 and the second metal-containing source/drain region 308 are spaced apart from each other in the active region adjacent an upper surface of the p-type well region 302. An inversion layer channel can be formed in a portion of the active region between the first metal-containing source/drain region 306 and the second metal-containing source/drain region 308, referred to hereinafter as the channel forming region 310 of the planar transistor. The first metal-containing source/drain region 306 and the second metal-containing source/drain region 308 may be respective metal silicide regions, for example, $CoSi_2$, $NiSi_2$ or $ErSi_2$ regions.

As such, a junction between the first metal-containing source/drain region 306 and the p-type well region 302, and a junction between the second metal-containing source/drain region 308 and the p-type well region 302, may form a schottky junction. The gate insulating layer 312 is formed on the channel forming region 310, and the floating gate conductive layer 314 is formed on the gate insulating layer 312. The gate insulating layer 312 may be a silicon oxide layer, and the floating gate conductive layer 314 may be a polysilicon layer. The floating gate conductive layer 314 acts as a gate electrode for the planar transistor. Accordingly, the first metal-containing source/drain region 306, the second metal-containing source/drain region 308, the channel forming region 310, the gate insulating layer 312, and the floating gate conductive layer 314 form the planar transistor.

Still referring to FIG. 3, the multiple tunnel junction structure MTJ is formed on the floating gate conductive layer 314. The multiple tunnel junction structure MTJ is formed by sequentially stacking a first tunnel barrier layer 316, a first channel conductive layer 318, a second tunnel barrier layer 320, a second channel conductive layer 322, and a third tunnel barrier layer 324. The first tunnel barrier layer 316, the second tunnel barrier layer 320, and the third tunnel barrier layer 324 may be respective silicon nitride layers. The first channel conductive layer 318 and the second channel conductive layer 322 may be respective undoped intrinsic polysilicon layers, or, alternatively, polysilicon layers doped with p-type impurity ions. It will be understood that additional tunnel barrier layers and/or channel conductive layers may be included in some embodiments of the present invention.

A data line conductive layer 326 and an insulating layer 328 are formed on the third tunnel barrier layer 324 on the uppermost surface of the multiple tunnel junction structure MTJ. The data line conductive layer 326 is connected to a data line, such as the second word line 108 of FIG. 1. The data line conductive layer 326 may be a double layer, such as a polysilicon layer and a metal silicide layer, and the insulating layer 328 may be a double layer, such as a silicon nitride layer and a silicon oxide layer. The floating gate conductive layer 314, the multiple tunnel junction structure MTJ, the data line conductive layer 326, and the insulating layer 328 are surrounded by a sidewall insulating layer 330. The sidewall insulating layer 330 may be a silicon oxide layer. A control gate conductive layer 332 is formed on the sidewall insulating layer 330. Accordingly, the vertical transistor is formed, including the floating gate conductive layer 314 as the drain region, the multiple tunnel junction structure MTJ as the channel region, the data line conductive layer 326 as the source region, the side insulating layer 330 as the gate insulating layer, and the control gate conductive layer 332 as the gate electrode.

As such, a scalable two-transistor memory (STTM) device is formed including a planar transistor and a vertical transistor. The planar transistor includes spaced apart metal silicide source/drain regions on a semiconductor substrate and a floating gate electrode on the substrate between the metal silicide source/drain regions that controls a channel region of the planar transistor. The vertical transistor includes a tunnel junction structure on the floating gate electrode and a control gate electrode on sidewalls of the tunnel junction structure that controls a channel region of the vertical transistor.

Figure 4:
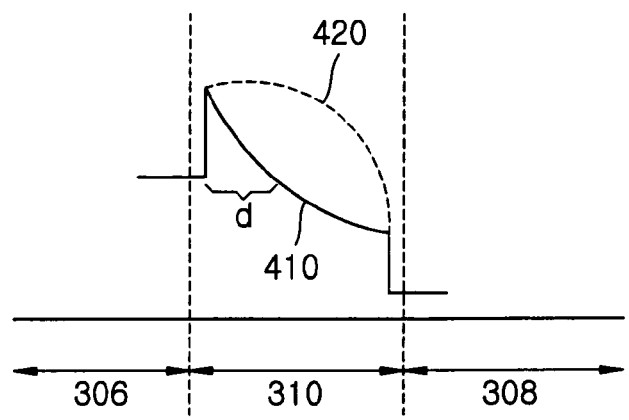
FIG. 4 illustrates an energy band diagram at a metal-semiconductor junction in a planar transistor of the STTM cell of FIG. 3.

FIG. 4 illustrates an energy band diagram at a metal-semiconductor junction in the planar transistor of the STTM cell of FIG. 3.

Referring to FIG. 4, the junction of the first metal-containing source/drain region 306 and the channel forming region 310 and the junction of the second metal-containing source/drain region 308 and the channel forming region 310 constitute respective schottky junctions. The channel forming region 310 exhibits a relatively high energy level when the device is in an "off" state, as illustrated by dotted line 420. However, the channel forming region 310 exhibits a relatively lower energy level in a vicinity of the junction with the first metal-containing source/drain region 306 when the device is in an "on" state, as illustrated by solid line 410, such that electrons from the first metal-containing source/drain region 306 (i.e., the source region) may penetrate through the energy barrier and enter the channel forming region 310. The electrons may then flow to the second metal-containing source/drain region 308 (i.e., the drain region). Accordingly, memory cell structures according to embodiments of the present invention may provide improved electrical characteristics, even when a length of the channel forming region 310 between the first metal-containing source/drain region 306 and the second metal-containing source/drain region 308 is decreased, as only a width d of the energy barrier is decreased while a height of the energy barrier is maintained. Consequently, electrons from the first metal-containing source/drain region 306 may enter the channel forming region 310 more easily. In other words, despite the decrease in distance between the first metal-containing source/drain region 306 and the second metal-containing source/drain region 308 due to increased device integration density, short channel effects may be reduced and/or avoided. Also, operating characteristics of the device may be further improved.

Programming operations in STTM cells according to some embodiments of the present invention will now be described. First, a data voltage is applied to the data line conductive layer 326 via the data line, and a program voltage is applied to the control gate conductive layer 332 via a control line. Accordingly, a barrier height between the data line conductive layer 326 and the floating gate conductive layer 314 is decreased, thereby generating a tunneling current that penetrates through the tunnel barrier layers 316, 320, and 324 within the multiple tunnel junction structure MTJ. The charges that make up the tunneling current are stored within the floating gate conductive layer 314. This alters the threshold voltage of the planar transistor. For example, when electrons are stored within the floating conductive layer 314, the threshold voltage of an n-type planar transistor is increased.

In order to read data stored within the STTM cell, a read voltage is applied to the control gate conductive layer 332, and a voltage of a suitable magnitude is applied to the first metal-containing source/drain region 306 (i.e., the source region) of the planar transistor. Then, the read voltage applied to the control gate conductive layer 332 is coupled to the floating gate conductive layer 314. The voltage at the floating gate conductive layer 314 forms an inversion layer channel at the channel forming region 310, allowing current to flow from the first metal-containing source/drain region 306 to the second metal-containing source/drain region 308. More particularly, when the threshold voltage of the planar transistor is higher than the floating gate voltage, current does not flow in the channel forming region 310. In contrast, when the threshold voltage is less than the floating gate voltage, current flows from the first metal-containing source/drain region 306 to the second metal-containing source/drain region 308. The shorter the length of the channel forming region 310, the narrower the width of the energy barrier of the schottky junction. Consequently, current flow from the first metal-containing source/drain region 306 to the second metal-containing source/drain region 308 may be increased, thereby improving read efficiency of the device. Furthermore, since the first metal-containing source/drain region 306 and the second metal-containing source/drain region 308 may be respective metal silicide regions, the resistances of the first and second metal-containing source/drain regions 306 and 308 may be less than that of conventional impurity regions.

FIGS. 5 through 10 are cross-sectional views illustrating exemplary operations for fabricating STTM cells according to some embodiments of the present invention.

Figure 5:
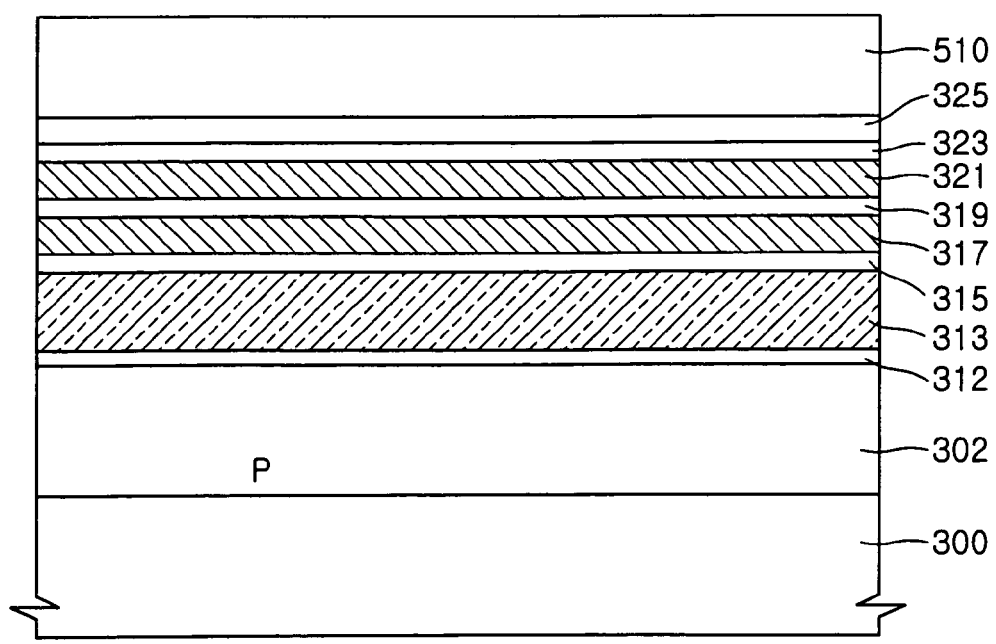
FIGS. 5 through 10 are cross-sectional views illustrating exemplary operations for fabricating STTM cells according some embodiments of the present invention.

Referring now to FIG. 5, a p-type well region 302 is formed on a semiconductor substrate 300. Then, an insulating layer, such as silicon oxide layer 312, is formed on the p-type well region 302. The silicon oxide layer 312 may form the gate insulating layer of the planar transistor. Thereafter, a first polysilicon layer 313, a first silicon nitride layer 315, a second polysilicon layer 317, a second silicon nitride layer 319, a third polysilicon layer 321, a third silicon nitride layer 323, a fourth polysilicon layer 325, and a first mask layer 510 are sequentially formed on the silicon oxide layer 312. The first polysilicon layer 313 and the fourth polysilicon layer 325 may be formed of a polysilicon layer that is heavily doped with n-type impurity ions. The second polysilicon layer 317 and the third polysilicon layer 321 may be formed of an intrinsic polysilicon layer and/or a polysilicon layer doped with p-type impurity ions.

Figure 6:
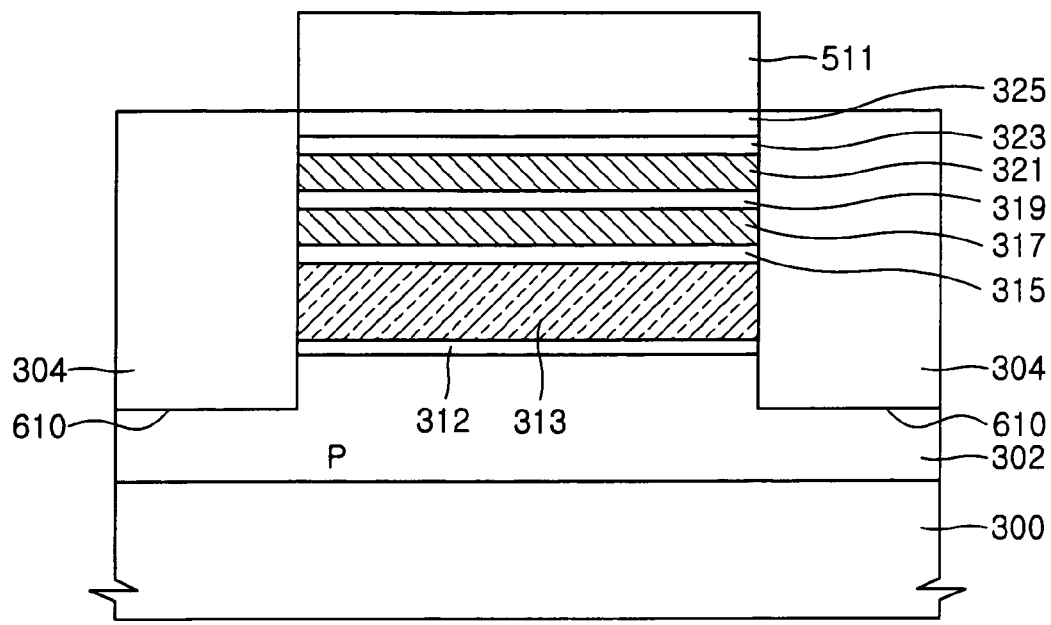

Referring to FIG. 6, the first mask layer 510 of FIG. 5 is patterned to form a mask layer pattern 511 that has an opening partially exposing a surface of the fourth polysilicon layer 325. Using the mask layer pattern 511 as an etch mask, exposed portions of the fourth polysilicon layer 325, the third silicon nitride layer 323, the third polysilicon layer 321, the second silicon nitride layer 319, the second polysilicon layer 317, the first silicon nitride layer 315, the first polysilicon layer 313, and the silicon oxide layer 312 are sequentially etched. Subsequently, an exposed portion of the p-type well region 302 is also removed to a predetermined depth, forming a trench 610. After removing the mask layer pattern 511, the trench 610 is filled with an insulating layer, such as an oxide layer, thereby forming an isolation layer 304.

Figure 7:
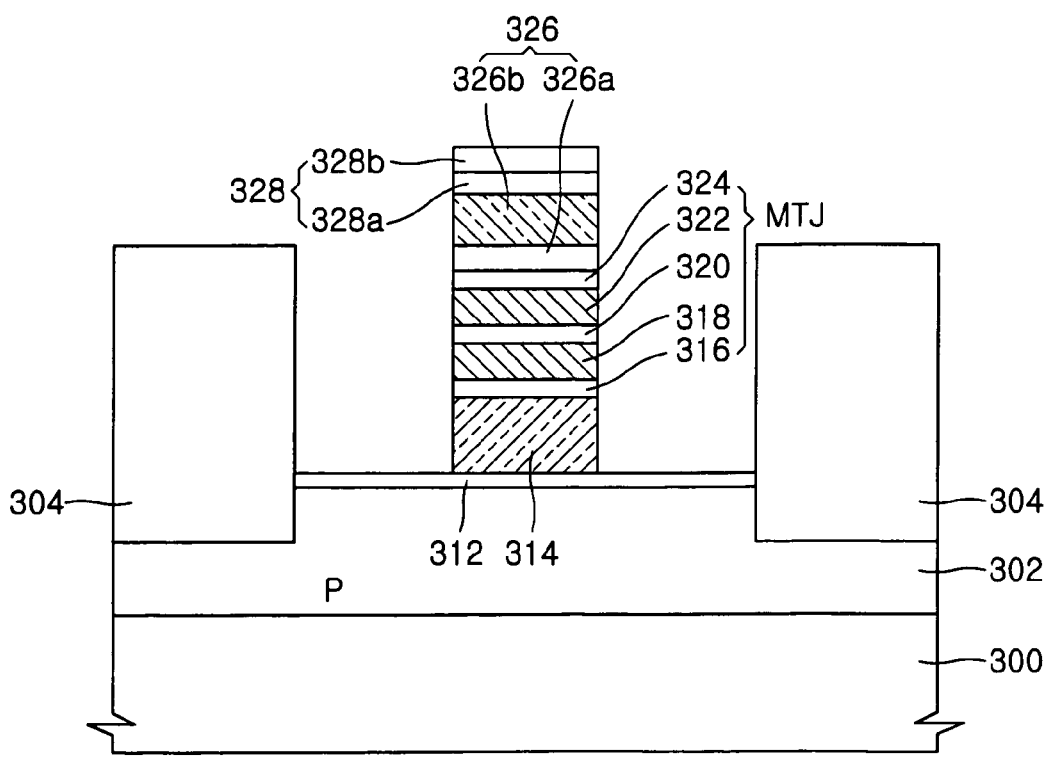

Referring to FIG. 7, a metal silicide layer, such as a tungsten silicide layer, is formed on the fourth polysilicon layer 325 shown in FIG. 6. Then, an insulating mask layer pattern 328 formed by sequentially stacking a first mask layer pattern 328a and a second mask layer pattern 328b is formed. The first mask layer pattern 328a may be a silicon nitride layer, and the second mask layer pattern 328b may be a silicon oxide layer. Thereafter, etching is performed using the insulating mask layer pattern 328 as an etch mask. Consequently, a first polysilicon layer pattern 314, a first silicon nitride layer pattern 316, a second polysilicon layer pattern 318, a second silicon nitride layer pattern 320, a third polysilicon layer pattern 322, a third silicon nitride layer pattern 324, a fourth polysilicon layer pattern 326a, and a tungsten silicide layer pattern 326b are sequentially formed on the silicon oxide layer 312. The first polysilicon layer pattern 314 forms a floating gate conductive layer. The first silicon nitride layer pattern 316, the second silicon nitride layer pattern 320, and the third silicon nitride layer pattern 324 form tunnel barrier layers. The second polysilicon layer pattern 318 and the third polysilicon layer pattern 322 form channel conductive layers. The fourth polysilicon layer pattern 326a and the tungsten silicide layer pattern 326b form a data line conductive layer 326. The tunnel barrier layers and the channel conductive layers form the multiple tunnel junction structure MTJ.

Figure 8:
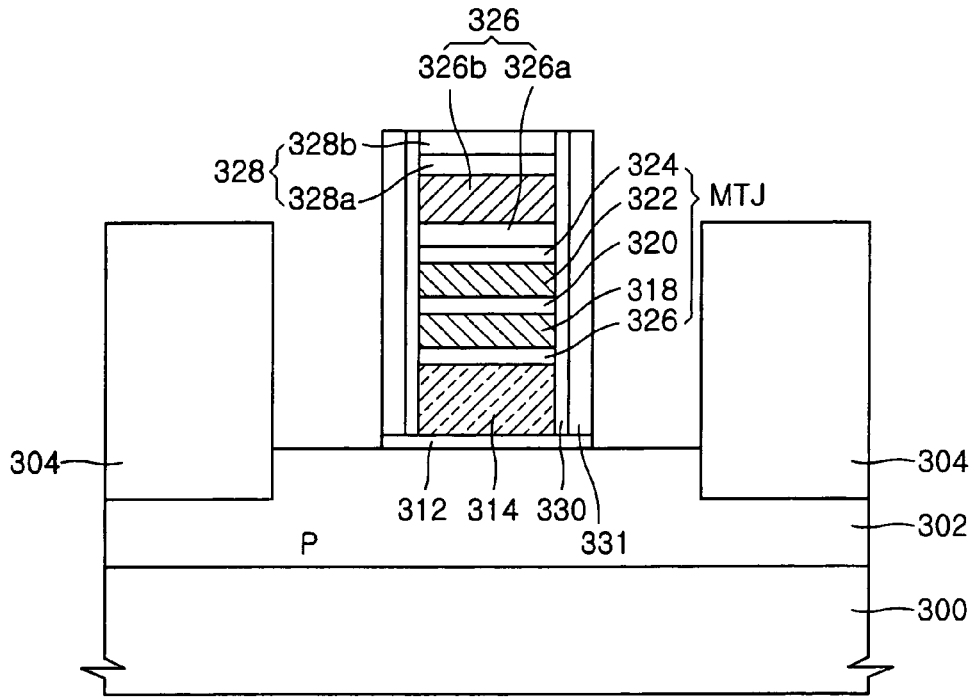

Referring to FIG. 8, a sidewall oxide layer 330 is formed as an insulating layer along sidewalls of the first polysilicon layer pattern 314, the multiple tunnel junction structure MTJ, the data line conductive layer 326, and the insulating mask layer pattern 328. The sidewall oxide layer 330 may be formed via oxidation. An additional spacer layer 331 is then formed on the sidewall oxide layer 330. The additional spacer layer 331 may be formed by forming an insulating layer on the entire surface of the structure, and then performing an etchback and cleaning process. Accordingly, the additional spacer layer 331 is formed as illustrated in FIG. 8, leaving the surface of the p-type well region 302 partially exposed.

Figure 9:
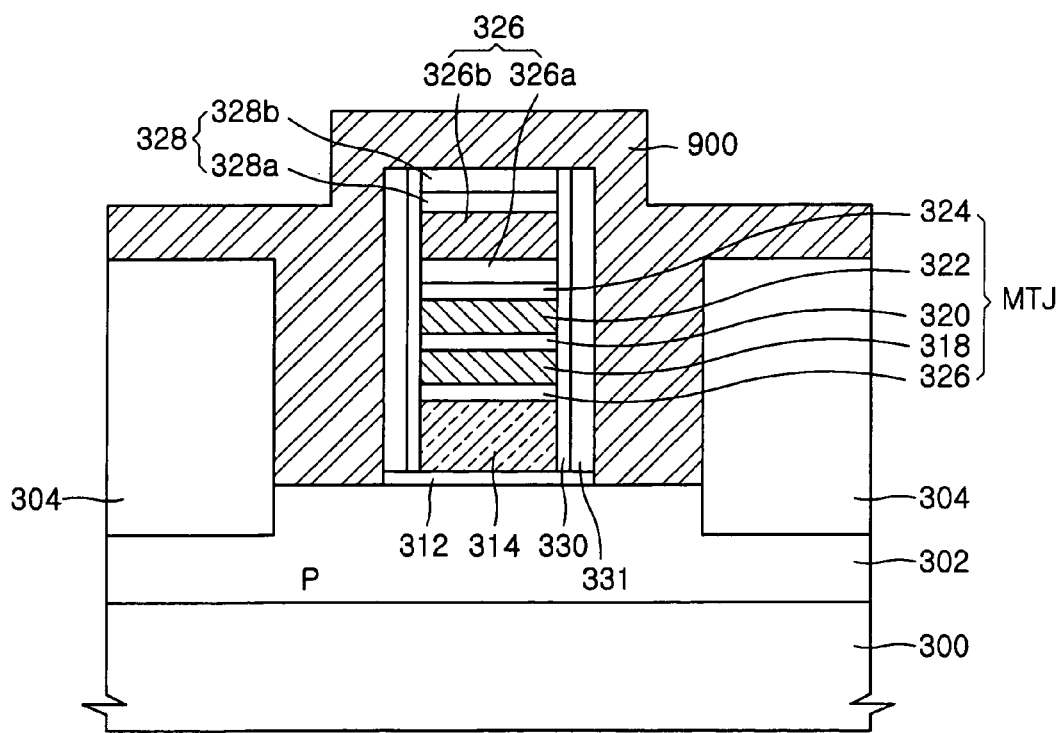

Referring to FIG. 9, a metal layer 900 is formed on the entire surface of the structure. The metal layer 900 may be a Co layer, a Ni layer, an Er layer, or another metal layer. The metal layer 900 is directly on the exposed portion of the p-type well region 302. Then, a silicidation process is performed. More particularly, a thermal treatment is performed at a predetermined temperature to incite a silicide reaction on the contact portion between the p-type well region 302 and the metal layer 900.

Figure 10:
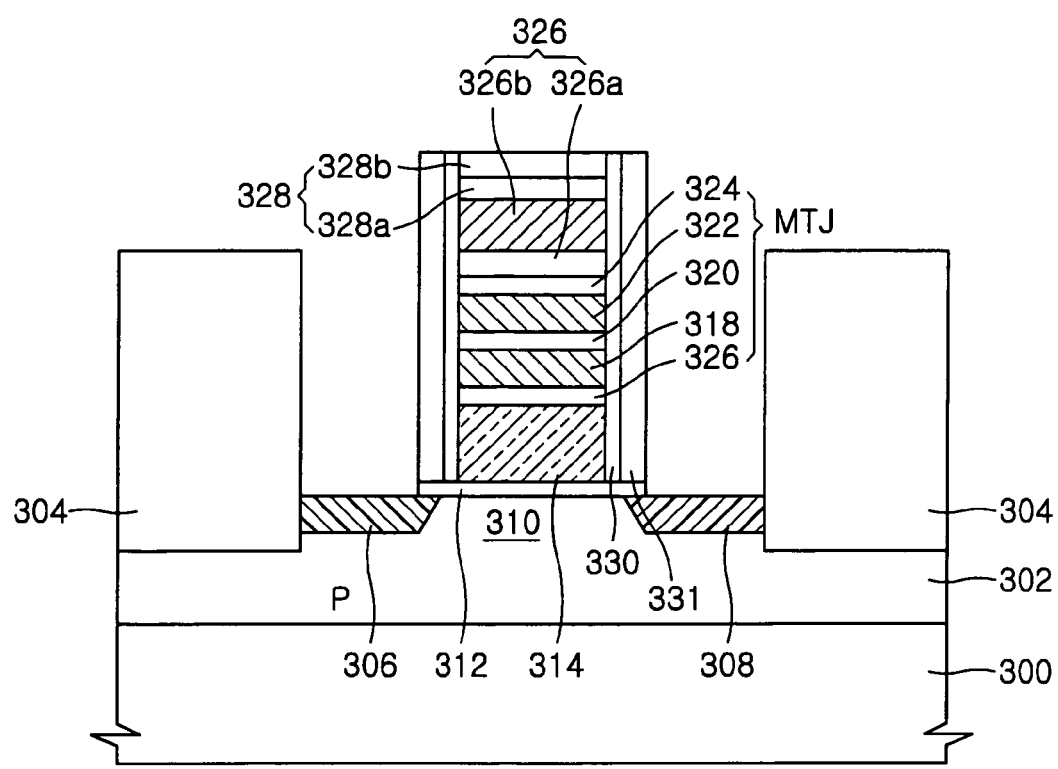

Referring to FIG. 10, the unreacted portions of metal layer 900 are removed by wet stripping. As such, a first metal silicide region 306 and a second metal silicide region 308 are formed adjacent the upper surface of the p-type well region 302. The first metal silicide region 306 and the second metal silicide region 308 respectively form the source region and the drain region for the planar transistor, and a portion therebetween forms the channel forming region 310. After removing the additional spacer layer 331, a control gate conductive layer 332 is formed on the entire surface of the structure, thereby fabricating an STTM cell according to embodiments of the present invention as illustrated in FIG. 3.

In STTM cell structures according to embodiments of the present invention as described above, a source region and a drain region of a planar transistor may be formed by metal silicide regions. As such, a junction between the source and drain regions and a channel forming region may form a schottky junction. Accordingly, even when the length of the channel forming region is reduced, device performance may not be significantly degraded. Rather, read efficiency of the device may even be improved. In addition, the source/drain resistance may be lower than that of conventional impurity regions. Further, methods of fabricating STTM cell structures according to embodiments of the present invention may enable the production of STTM cells as described above using a silicidation process.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. A method of forming a scalable two-transistor memory (STTM) device, comprising:

forming a vertical transistor structure including a storage node on a semiconductor substrate and a tunnel junction structure on the storage node;

forming a metal layer on a surface of the substrate adjacent respective opposite sides of the storage node;

performing a silicidation process on the substrate including the metal layer on the surface thereof to form spaced apart metal silicide source/drain regions without prior formation of implanted diffusion regions in the substrate adjacent the respective opposite sides of the storage node to define a planar transistor including the storage node of the vertical transistor structure as a floating gate electrode that controls a channel region of the planar transistor;

removing unreacted portions of the metal layer from the metal silicide source/drain regions at the surface of the substrate after performing the silicidation process; and then forming a control gate electrode on opposing sidewalls of the tunnel junction structure to define a vertical transistor, wherein the control gate electrode controls a channel region of the vertical transistor.

2. The method of claim 1, wherein forming the vertical transistor structure comprises:

forming the storage node on a surface of the substrate;

forming the tunnel junction structure including a tunnel barrier layer and a channel conductive layer on the storage node; and forming sidewall insulating layers on opposing sidewalls of the tunnel junction structure.

3. The method of claim 1, wherein the metal silicide source/drain regions are formed of, cobalt silicide, nickel silicide, and/or erbium silicide.

4. The method of claim 1, wherein forming the vertical transistor structure further comprises:

forming a data line conductive layer on the tunnel junction structure.

5. The method of claim 4, wherein forming the tunnel junction structure comprises:

alternately forming a plurality of tunnel barrier layers and channel conductive layers on the floating gate electrode.

6. The method of claim 5, wherein the storage node comprises a polysilicon layer doped with n-type impurity ions, wherein the tunnel barrier layers comprise silicon nitride layers, wherein the channel conductive layers comprise intrinsic polysilicon layers and/or polysilicon layers doped with p-type impurity ions, and wherein the data line conductive layer comprises a polysilicon layer doped with n-type impurity ions and a metal silicide layer.

* * * * *